(12) United States Patent
Chung et al.

(10) Patent No.: US 12,094,733 B2
(45) Date of Patent: *Sep. 17, 2024

(54) SUBSTRATE TREATMENT APPARATUS

(71) Applicant: SEMES CO., LTD., Cheonan-si (KR)

(72) Inventors: Young Dae Chung, Incheon (KR); Won Geun Kim, Goyang-si (KR); Jee Young Lee, Incheon (KR); Ji Hoon Jeong, Hwaseong-si (KR); Tae Shin Kim, Suwon-si (KR); Se Hoon Oh, Cheonan-si (KR); Pil Kyun Heo, Hwaseong-si (KR); Hyun Goo Park, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 380 days.

This patent is subject to a terminal disclaimer.

(21) Appl. No.: 17/073,342

(22) Filed: Oct. 17, 2020

(65) Prior Publication Data

US 2021/0118701 A1 Apr. 22, 2021

(30) Foreign Application Priority Data

Oct. 21, 2019 (KR) .................. 10-2019-0130517

(51) Int. Cl.
*H01L 21/67* (2006.01)
*H01L 21/306* (2006.01)
*C09K 13/04* (2006.01)

(52) U.S. Cl.
CPC .... *H01L 21/6708* (2013.01); *H01L 21/30604* (2013.01); *H01L 21/67115* (2013.01); *C09K 13/04* (2013.01)

(58) Field of Classification Search
None
See application file for complete search history.

(56) References Cited

U.S. PATENT DOCUMENTS

| 7,198,677 | B2 * | 4/2007 | Yoo ..................... C23C 16/4584 156/345.23 |
| 8,163,129 | B2 * | 4/2012 | Lee ................... H01L 21/67028 219/121.68 |
| 9,799,538 | B2 | 10/2017 | Kaneko et al. |
| 2002/0136971 | A1 * | 9/2002 | Ito ......................... B23K 26/04 430/30 |
| 2002/0167581 | A1 | 11/2002 | Cordingley |
| 2006/0113284 | A1 | 6/2006 | Umetsu |

(Continued)

FOREIGN PATENT DOCUMENTS

| CN | 1770424 | 5/2006 |
| JP | 2008-242147 | 10/2008 |

(Continued)

OTHER PUBLICATIONS

Office Action from Chinese Patent Office on Nov. 28, 2023.

*Primary Examiner* — Sylvia Macarthur

(57) ABSTRACT

Disclosed is a substrate treatment apparatus including a rotation unit that supports and rotates a substrate, a chemical discharge unit that discharges a chemical solution to the rotation unit, a chemical recovery unit disposed close to the rotation unit and configured to recover the chemical solution scattering from the rotation unit, and a laser irradiation unit that applies a laser beam to the substrate and heats the substrate.

20 Claims, 6 Drawing Sheets

(56) References Cited

U.S. PATENT DOCUMENTS

| | | | |
|---|---|---|---|
| 2008/0193654 A1* | 8/2008 | Fukuda | H01L 21/6708 427/372.2 |
| 2015/0136186 A1* | 5/2015 | Brown | H01L 21/67051 134/113 |
| 2016/0025409 A1* | 1/2016 | Miyazaki | H01L 21/67115 34/526 |
| 2016/0221021 A1* | 8/2016 | Yang | B05B 17/0623 |
| 2018/0337070 A1* | 11/2018 | Bang | B08B 3/08 |
| 2019/0115224 A1* | 4/2019 | Lee | H01L 21/67115 |
| 2019/0311923 A1* | 10/2019 | Kim | H01L 21/6708 |
| 2020/0075362 A1* | 3/2020 | Kwon | H01L 21/67051 |
| 2021/0060625 A1* | 3/2021 | Shin | H01L 21/67098 |
| 2021/0118701 A1* | 4/2021 | Chung | H01L 21/30604 |
| 2022/0068698 A1* | 3/2022 | Jeong | H01L 21/67051 |

FOREIGN PATENT DOCUMENTS

| | | |
|---|---|---|
| KR | 10-2014-0067892 A | 6/2014 |
| KR | 1020190029825 | 3/2019 |

* cited by examiner

SUBSTRATE TREATMENT APPARATUS

CROSS REFERENCE TO RELATED APPLICATION

The present application claims priority to Korean Patent Application No. 10-2019-0130517, filed Oct. 21, 2019 in the Korean Intellectual Patent Office (KIPO), the entire contents of which are herein incorporated by reference.

BACKGROUND OF THE INVENTION

1. Field of the Invention

The present invention relates to a substrate treatment apparatus and, more particularly, to a substrate treatment apparatus that may be used to manufacture a semiconductor device.

2. Description of the Related Art

The miniaturization of circuit patterns is more strongly required as the density, integration, and performance of semiconductor devices are increasing. For example, among various semiconductor devices, a 3D V-NAND flash memory which is one of memory devices is changing from a 24-layer or 32-layer stack structure to a 64-layer stack structure.

The multi-layer circuits may be manufactured as designed by properly performing deposition and etching. Therefore, precisely controlled etching and deposition techniques are required to produce over 64-layer 3D memory devices.

As to the etching process that is performed multiple times throughout the manufacturing of semiconductor devices, it is common that a semiconductor substrate is immersed in an aqueous solution containing phosphoric acid. Such conventional etching methods have limitations on etching uniformity and etching rate, making it difficult to meet the miniaturization requirement of circuit patterns. Therefore, there is a need for a substrate treatment apparatus capable of increasing an etching rate.

DOCUMENT OF RELATED ART

Patent Document
(Patent Document 1) Korean Patent Application Publication No. 2014-0067892

SUMMARY OF THE INVENTION

An objective of the present invention is to provide a substrate treatment apparatus capable of improving an etching rate.

According to an exemplary embodiment of the present invention, a substrate treatment apparatus includes a rotation unit configured to support and rotate a substrate, a chemical discharge unit configured to discharge a chemical solution to the rotation unit, a chemical recovery unit disposed close to the rotation unit and configured to collect a portion of the chemical solution scattered by the rotation unit and a laser irradiation unit configured to emit a laser beam to the substrate and heat the substrate.

The rotation unit includes a supporting member made of a transparent material so that the laser beam emitted by the laser irradiation unit is transmitted through the supporting member, and a rotation member engaged with the supporting member and configured to support an edge of the supporting member, the rotation member having a vertical through hole extending from a top of the rotation member to a bottom thereof.

The laser irradiation unit is positioned below the rotation unit and is configured to emit the laser beam toward the substrate positioned on the rotation unit.

The laser irradiation unit includes a laser generation member configured to generate the laser beam, a laser transfer member connected to the laser generation member and configured to receive the laser beam generated by the laser generation member, a laser inspection member connected to the laser transfer member and configured to inspect a state of the laser beam transferred through the laser transfer member, and a lens member connected to the laser inspection member and configured to refract the laser beam transferred by the laser transfer member and to irradiate the substrate with the laser beam refracted by the lens member.

The laser beam has a wavelength which is absorbed by the substrate. The laser inspection member includes a reflection unit configured to reflect a first portion of the laser beam transferred by the laser transfer member toward the lens member and to pass a second portion of the laser beam, an image pickup unit engaged with the reflection unit and configured to capture an image of the second portion of the laser beam passing through the reflection unit, and a sensing unit engaged with the reflection unit and configured to sense an intensity of the laser beam which is incident on the reflection unit.

The lens member includes a plurality of lenses configured to refract the second portion of the laser beam, and a lens barrel configured to accommodate the plurality of lenses and to allow a distance between at least two lenses of the plurality of lenses to be varied.

The substrate treatment apparatus further includes a thermometer configured to measure a temperature of the substrate, and a controller configured to control, in response to the temperature of the substrate measured by the temperature measuring member, a power of the laser beam generated by the laser irradiation unit.

The image pickup unit receives the second portion of the laser beam via the reflection unit from the laser irradiation unit, converts the second portion of the laser beam to image data, and analyzes the image data. The rotation member includes a first portion near the laser irradiation unit and a second portion near the supporting member, and the rotation member has an inner diameter that gradually increases from the first portion to the second portion.

The substrate treatment apparatus further includes a drive member engaged with the rotation member and configured to rotate the rotation member.

The substrate treatment apparatus further includes a housing member engaged with the rotation unit and configured to accommodate the laser irradiation unit, and a lifter engaged with the housing member and configured to lift the housing member so that the rotation unit is moved upward and downward relative to the chemical recovery unit.

The housing member includes an upper portion which is coupled to a lower portion of the rotation unit, and the laser irradiation unit is disposed on a bottom surface in the housing member.

The housing member maintains, when the housing member is moved up and down by the lifter, a constant relative position between the laser irradiation unit and the rotation unit.

The chemical recovery unit is configured to surround a perimeter of the rotation unit.

The chemical recovery unit includes a plurality of inlets separated from each other and arranged in a vertical direction.

The lifter moves the chemical recovery unit upward and downward so that a selected one of the plurality of inlets is positioned close to the supporting member.

The chemical recovery unit includes a chemical solution regeneration unit configured to recycle the portion of the chemical solution collected by the chemical recovery unit.

The chemical solution ejected from the chemical discharge unit is an aqueous phosphoric acid solution.

According to an exemplary embodiment of the present invention, a substrate treatment apparatus includes a rotation unit including a rotation member configured to rotate a substrate and a supporting member made of a transparent material to transmit a laser beam therethrough and configured to support the substrate, a chemical discharge unit configured to discharge a chemical solution to the rotation unit, a chemical recovery unit disposed to surround a perimeter of the rotation unit and configured to collect a chemical solution scattered from the rotation unit and to recycle the recovered chemical solution, and a laser irradiation unit positioned below the rotation unit and configured to emit a laser beam to the substrate and to heat the substrate. The laser irradiation unit includes a laser generation member configured to generate the laser beam having a wavelength that is absorbed by the substrate and to emit the laser beam to the substrate, a laser transfer member connected to the laser generation member and configured to receive the laser beam generated by the laser generation member, a laser inspection member connected to the laser transfer member and configured to inspect a state of the laser beam transferred through the laser transfer member, and a lens member connected to the laser inspection member and configured to refract the laser beam transferred by the laser transfer member and to irradiate the substrate with the laser beam refracted by the lens member.

According to an exemplary embodiment of the present invention, the substrate treatment apparatus includes the laser irradiation unit that irradiates a substrate with a laser beam and heats the substrate. The substrate treatment apparatus applies a laser beam from a long distance, thereby dramatically increasing the etching rate of phosphoric acid serving as a chemical solution.

The substrate treatment apparatus may rapidly raise and lower the temperature of the substrate while treating the surface of the substrate, thereby precisely controlling the temperature of the substrate. The substrate treatment apparatus may apply a laser beam having a wavelength that may be easily absorbed by the substrate, thereby improving the optical efficiency.

In the process of treating a substrate using the substrate treatment apparatus according to one embodiment of the present invention, phosphoric acid discharged to the substrate may be heated by the laser irradiation unit when the substrate is heated. Accordingly, the substrate treatment apparatus according to the present invention may significantly increase the etching rate (ER) compared to conventional counterparts that have only a function of discharging phosphoric acid to a substrate. Therefore, the substrate treatment apparatus according to the invention enables an etching process that may cope with high density, high integration, and high performance of semiconductor devices.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE EXEMPLARY EMBODIMENTS

Figure 1:
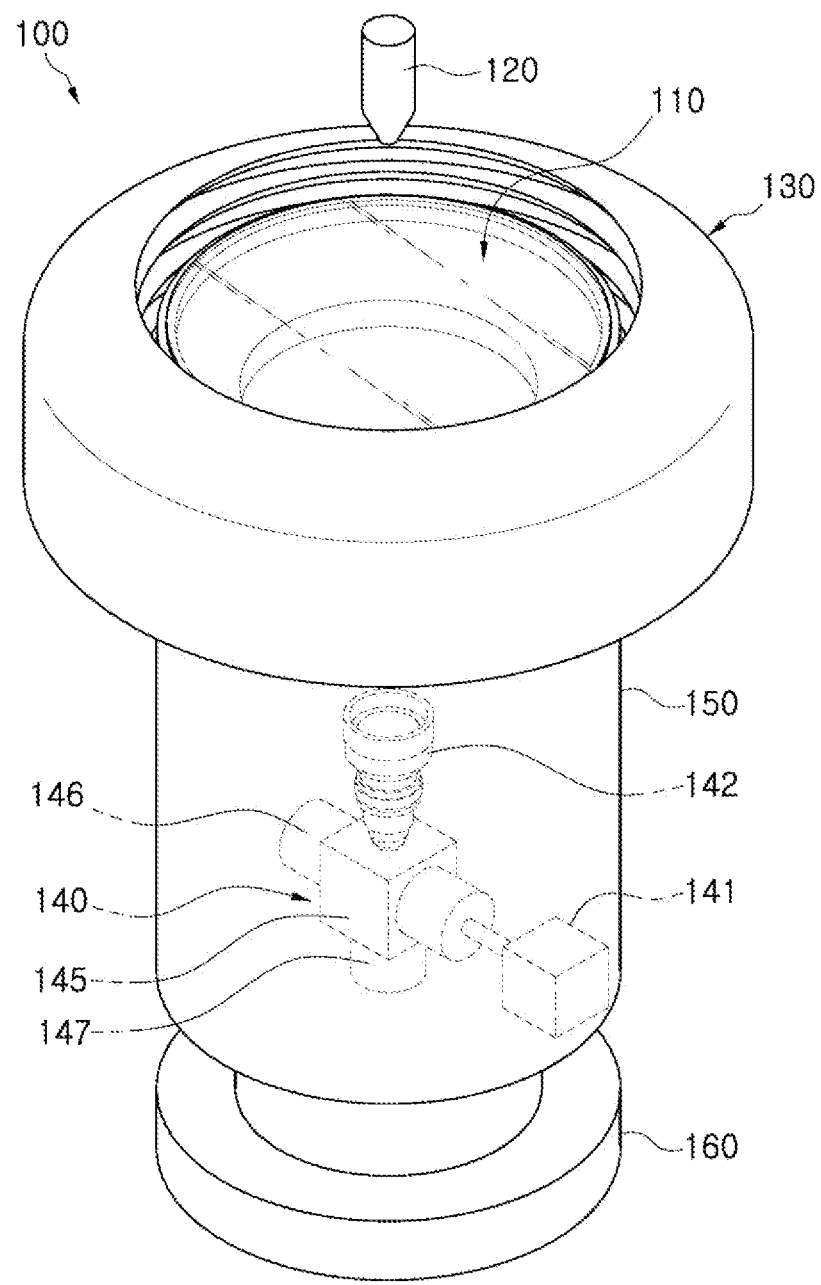
FIG. 1 is a perspective view illustrating a substrate treatment apparatus according to a first embodiment of the present invention.

Herein below, exemplary embodiments of the present invention will be described in detail with reference to the accompanying drawings such that the invention may be easily practiced by those ordinarily skilled in the art to which the present invention pertains. The present invention may be embodied in various forms and should not be construed as being limited to the exemplary embodiments disclosed herein.

A description of elements that are not related to the invention will be omitted to clarify the invention, and identical or similar elements are denoted by identical or similar reference characters throughout the drawings and the detailed description below.

In various embodiments, components having the same configuration will be denoted by the same reference numerals, and only a representative embodiment will be described. For the other exemplary embodiments, only components that differ from those of the representative embodiment will not be described.

When an element is described as being "connected to", "combined with", or "coupled to" another element, it should be understood that the element may be connected to, combined with, or coupled to another element directly or with another element interposing therebetween. It will be further understood that the terms "comprises", "comprising", "includes", and/or "including," when used herein, specify the presence of stated features, integers, steps, operations, elements, and/or components, but do not preclude the presence or addition of one or more other features, integers, steps, operations, elements, components, and/or groups thereof.

In addition, unless otherwise defined, all terms including technical and scientific terms used herein have the same meaning as commonly understood by those who are ordinarily skilled in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
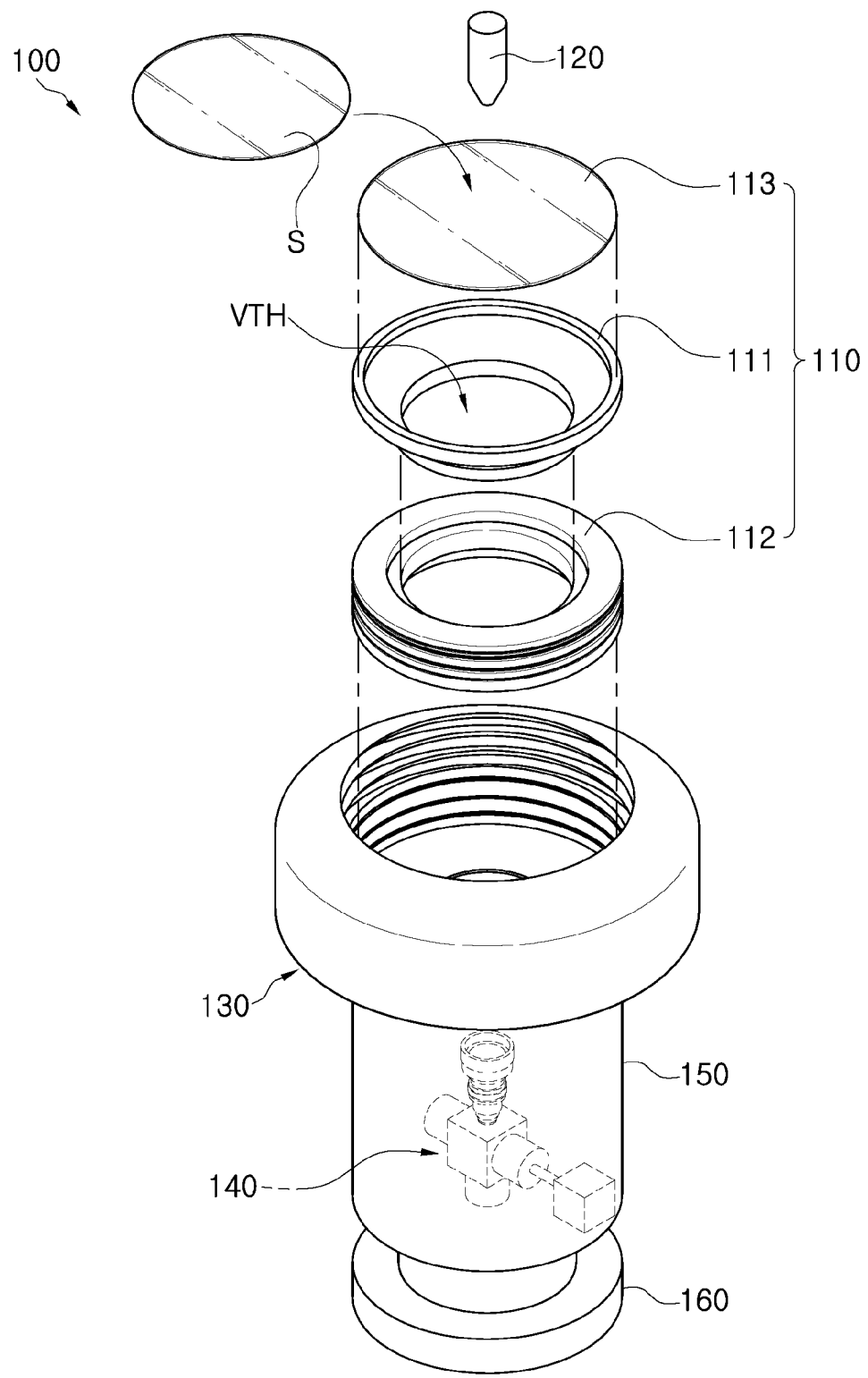
FIG. 2 is an exploded perspective view of the substrate treatment apparatus.
Figure 3:
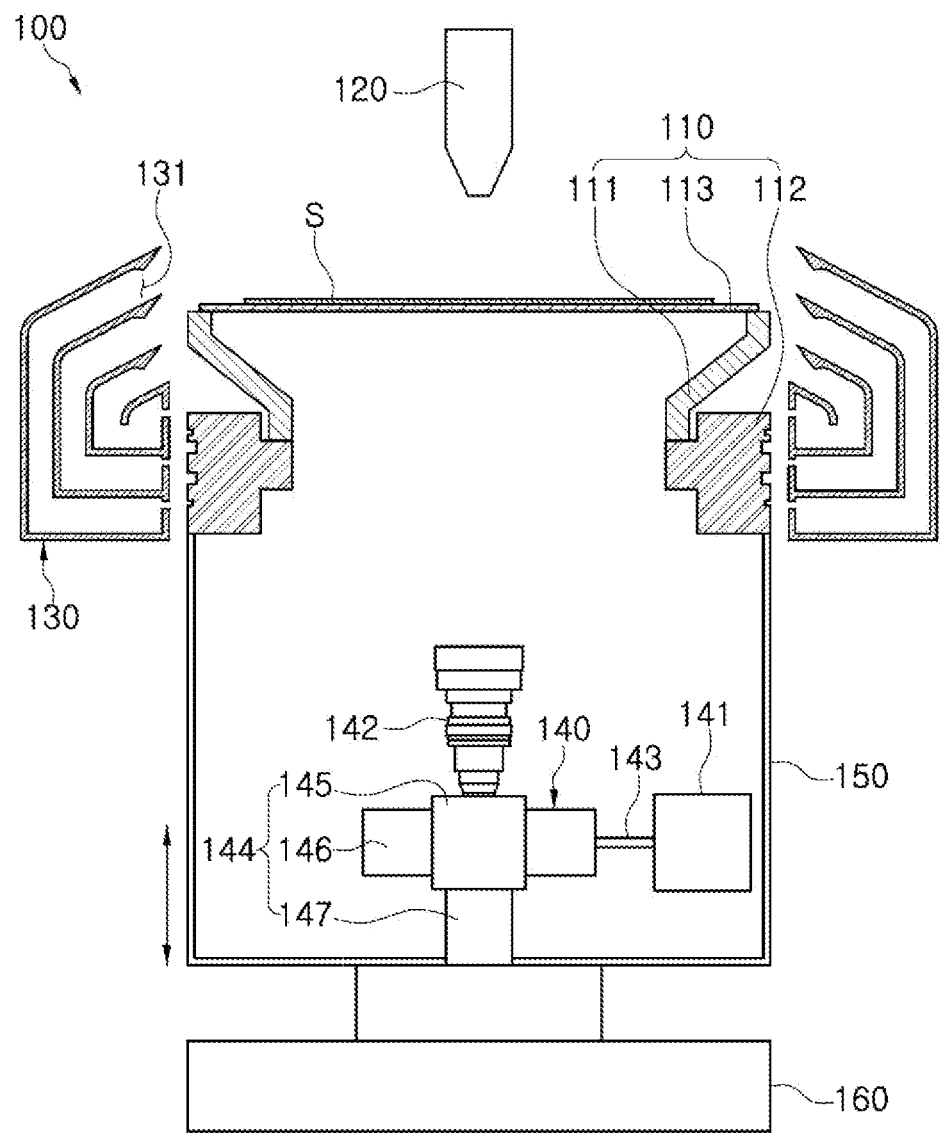
FIG. 3 is a cross-sectional view of the substrate treatment apparatus.

Referring to FIGS. 1 to 3, according to one embodiment of the present invention, a substrate treatment apparatus 100 includes a rotation unit 110, a chemical discharge unit 120, a chemical recovery unit 130, and a laser irradiation unit 140.

The rotation unit 110 supports a substrate S. The rotation unit 110 rotates the substrate S. The rotation unit 110 has a circular upper surface when viewed from above. The substrate S is seated on the upper surface of the rotation unit 110. When an upper portion of the rotation unit 110 is rotated, the substrate S is rotated together. When a chemical solution is ejected to the center of the substrate S, the chemical solution spreads to the edge of the substrate S due to centrifugal force.

The rotation unit 110 includes a supporting member 113, a rotation member 111, and a drive member 112.

The supporting member 113 supports the substrate S. The supporting member 113 is larger in size than the substrate S. When the substrate S is a circular wafer, the supporting member 113 has a larger diameter than the wafer.

The supporting member 113 is made of a transparent material. Accordingly, the laser emitted by the laser irradiation unit 140 may pass through the supporting member 113. The supporting member 113 is made of a corrosion-resistant material that does not react with the chemical solution. For example, the supporting member 113 is made of quartz or glass.

The rotation member 111 supports a periphery portion of the supporting member 113. The rotation member 111 is engaged with the supporting member 113 and has a vertical through hole VTH extending from the top of the rotation member to the bottom of the rotation member. In an example embodiment, the vertical through hole VTH may be symmetric with respect to an extending direction along which the vertical trough hole VTH extends from the top to the bottom.

The rotation member 111 has an inner diameter that gradually increases from a portion near the laser irradiation unit 140 to a portion near the supporting member 113. That is, the rotation member 111 has a cylindrical shape having the inner diameter increasing from the bottom to the top thereof. Therefore, a laser beam L generated by the laser irradiation unit 140 described below (see FIG. 5) is emitted to the substrate S without being interfered with by the rotation member 111.

The drive member 112 is engaged with the rotation member 111 to rotate the rotation member 111. Any driving device may be used as the drive member 112 if it may rotate the rotation member 111.

The chemical discharge unit 120 discharges a chemical solution to the rotation unit 110. The chemical discharge unit 120 pumps a chemical solution stored in a storage tank (not illustrated) and ejects the chemical solution to the substrate S.

The chemical solution may be used for a variety of purposes. The chemical solution may be any one or more solutions selected from the group consisting of fluoric acid (HF), sulfuric acid ($H_3SO_4$), nitric acid ($HNO_3$), phosphoric acid ($H_3PO_4$), and SC-1 solutions (mixed solutions of ammonium hydroxide ($NH_4OH$), hydrogen peroxide ($H_2O_2$), and water ($H_2O$)). Here, when the substrate treatment apparatus 100 is used in an etching process, the chemical solution discharged from the chemical discharge unit 120 may be an aqueous phosphoric acid solution.

In addition, the chemical solution may be deionized water (DIW) used as a cleaning agent, nitrogen ($N_2$) used as a drying gas, isopropyl alcohol (IPA), or the like.

The chemical recovery unit 130 is positioned close to the rotation unit 110. The chemical recovery unit 130 collects a chemical solution escaped (i.e., ejected) from the rotation unit 110. In more detail, the chemical recovery unit 130 is installed to surround the entire circumference of the rotation unit 110 and recovers a chemical solution scattering from the rotation unit 110.

For example, the external shape of the chemical recovery unit 130 is a block shape having an opening at an upper portion thereof. The opening in the upper portion of the chemical recovery unit 130 is used as an inlet for loading and unloading the substrate S.

The chemical recovery unit 130 may separately recover different chemical solutions used in a manufacturing process. The chemical recovery unit 130 has a plurality of inlets 131 through which various chemicals may be introduced into the chemical recovery unit 130.

The inlets 131 are arranged in line along a vertical direction. That is, the inlets 131 are positioned at different heights.

In a process of treating the substrate S, each of the various chemicals may be separately introduced into and stored in the chemical recovery unit 130. For example, the chemicals introduced into the chemical recovery unit through the inlets 131 are transferred to external chemical regeneration units (not illustrated) via recovery lines so that the chemicals may be reused or recycled. The chemical regeneration unit is an apparatus for regenerating (i.e., recycling) a chemical so as to be reused by controlling the concentration and temperature of the chemical used and filtering the chemical.

In the process of treating the substrate S, contaminants such as particles generated during the treatment process may be introduced into the chemical recovery unit 130 or fumes may be generated from the remaining chemical in the chemical recovery unit. These contaminants are removed by the chemical regeneration unit. Therefore, it is possible to prevent the contaminants from contaminating the substrate S in the substrate treatment process.

The chemical recovery unit 130 and the chemical discharge unit 120 described above are well-known ones that are usually used in conventional substrate treatment apparatuses. Therefore, a detailed description of the chemical recovery unit 130 will be omitted.

The laser irradiation unit 140 emits a laser beam to the substrate S and heats the substrate S.

The laser irradiation unit 140 is positioned below the rotation unit 110. The laser irradiation unit 140 applies a laser beam to the substrate S placed on the rotation unit 110.

As described above, the laser beam emitted by the laser irradiation unit 140 passes through the supporting member 113 of the rotation unit 110 and is incident on the substrate S. Therefore, the substrate S may be heated to a specific temperature by the laser beam.

Figure 4:
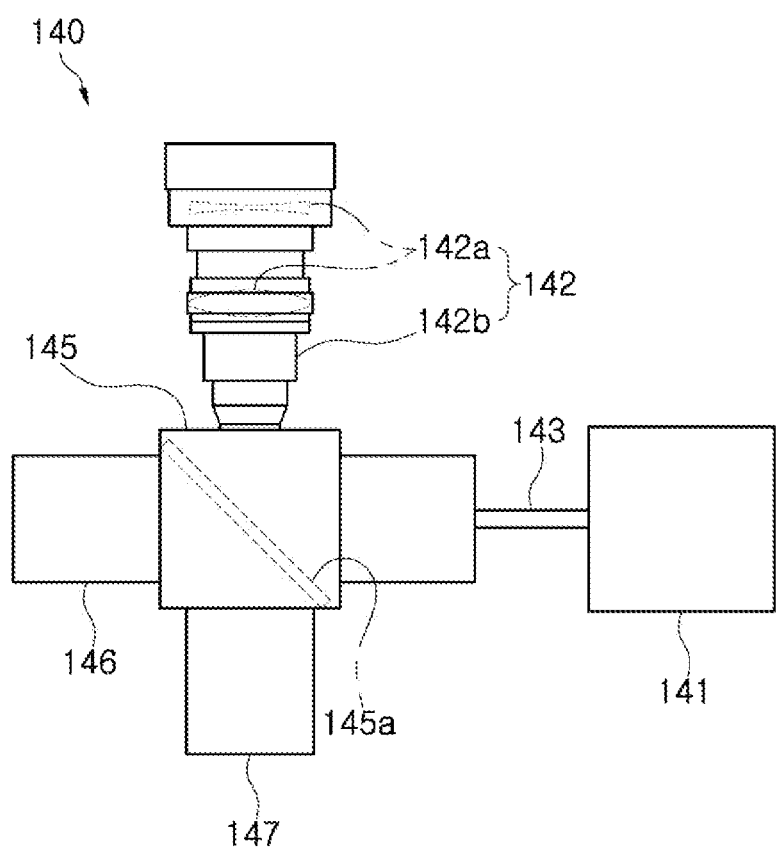
FIG. 4 is a view illustrating a laser irradiation unit included in the substrate treatment apparatus.

Referring to FIG. 4, the laser irradiation unit 140 includes a laser generation member 141, a lens member 142, a laser transfer member 143, and a laser inspection member 144.

The laser generation member 141 may generate a laser beam. The laser generation member 141 applies a laser beam having a wavelength that may be easily absorbed by the substrate. Therefore, the substrate may be sufficiently heated although the laser generation member 141 does not irradiate the substrate with a laser beam with an excessively strong power. That is, the laser generation member 141 may improve light efficiency.

The lens member 142 deflects the laser beam generated by the laser generation member 141 so that the laser beam may be directed toward the substrate.

The lens member 142 includes multiple lenses 142a and a lens barrel 142b. The lenses 142a refract the laser beam. The lens barrel 142b accommodates the lenses 142a and allows a distance between at least two lenses of the lenses 142a to be varied. In an example embodiment, the lens barrel 142b may be stretched or contracted to adjust the distance between at least two lenses by applying a multi-stage telescope type. Therefore, the laser beam generated by the laser generation member 141 is refracted while passing through the lens member 142 and is uniformly incident on the entire area of the substrate.

In the drawings, two lenses 142a are illustrated. However, the two lenses are only illustrative. Depending on the design of the substrate treatment apparatus 100, the number and type (convex lens and concave lens) of the lenses 142a are appropriately selected.

The laser transfer member 143 couples (i.e., connect) the laser generation member 141 and the reflection unit 145 to each other, and transfers the laser beam generated by the laser generation member 141 to a reflection mirror 145a of the reflection unit. An example of the laser transfer member 143 includes an optical fiber.

The laser inspection member 144 is installed between the laser transfer member 143 and the lens member 142 and inspects the state of the laser beam.

The laser inspection member 144 includes a reflection unit 145, an image pickup unit 146, and a sensing unit 147.

The reflection unit 145 reflects a portion of the laser beam generated by the laser generation member 141 and passes the remaining portion of the laser beam therethrough. For example, the reflection unit 145 includes a reflection mirror 145a installed at an angle of 45°. The laser beam passing through the reflection mirror 145a is incident on the image pickup unit 146. The laser beam reflected by the reflection mirror 145a is directed toward the lens member 142.

The image pickup unit 146 is coupled to the reflection unit 145 and captures the laser beam passing through the reflection unit 145 and converts it into image data. The image pickup unit 146 analyzes the image data to determine whether the laser beam is output by the laser generation member 141. In an example embodiment, the image pickup unit 146 may provide the result of analyzing the image data to a position controller (not shown here). The position controller may control, in response to the analyzing result, the laser irradiation unit 140 such that a direction of the laser beam generated from the laser irradiation unit 140 is adjusted. In an example embodiment, the image pickup unit 146 may include a complementary metal-oxide-semiconductor (CMOS) image sensor or a charge-coupled device image sensor.

The sensing unit 147 is coupled to the reflection unit 145 and senses the intensity (output) of the laser beam incident on the reflection unit 145. The sensing unit 147 may be a photo detector. When the intensity of the laser beam is excessively strong, the substrate may be rapidly heated. When the intensity of the laser beam is too weak, it may take a long time for the substrate to be heated. The sensing unit 147 determines whether the intensity of the laser beam is appropriate.

The substrate treatment apparatus 100 according to one embodiment of the present invention may further include a housing member 150 and a lifter 160.

The housing member 150 is coupled to the rotation unit 110 and accommodates the laser irradiation unit 140. An upper portion of the housing member 150 is coupled to a lower portion of the rotation unit 110.

For example, the upper portion of the housing member 150 is engaged with the lower portion of the drive member 112 included in the rotation unit 110. The housing member 150 has an internal space and the laser irradiation unit 140 is installed on the bottom surface in the internal space of the housing member 150.

The housing member 150 allows the rotation unit 110 and the laser irradiation unit 140 to be lifted together by the lifter 160 described below. This is to prevent the relative position of the laser irradiation unit 140 and the rotation unit 110 from being changed.

In general, optical alignment of optical devices is not easy. That is, when the relative position (distance or angle) of the laser irradiation unit 140 relative to the rotation unit 110 is changed, the laser beam is not globally and uniformly applied to the entire area of the substrate and may be locally applied to the substrate.

However, according to one embodiment of the present invention, the substrate treatment apparatus 100 uses the housing member 150 to prevent the relative position of the rotation unit 110 and the laser irradiation unit 140 from being changed. Accordingly, once the optical alignment is performed when the laser irradiation unit 140 is initially installed, it is not necessary to perform the optical alignment operation afterwards.

The housing member 150 also can prevent foreign matter such as dust from entering the laser irradiation unit 140.

The lifter 160 is coupled to the housing member 150 and raises and lowers the housing member 150. The lifter 160 allows the rotation unit 110 to move up and down relative to the chemical recovery unit 130.

The lifter 160 raises or lowers the housing member 150 and positions the supporting member 113 included in the rotation unit 110 to be close to the chemical recovery unit 130. Accordingly, after a chemical solution is discharged from the chemical discharge unit 120, the lifter 160 adjusts the height of the chemical recovery unit so that a chemical solution may be introduced into a target inlet of the multiple inlets 131 arranged in the vertical direction.

Figure 5:
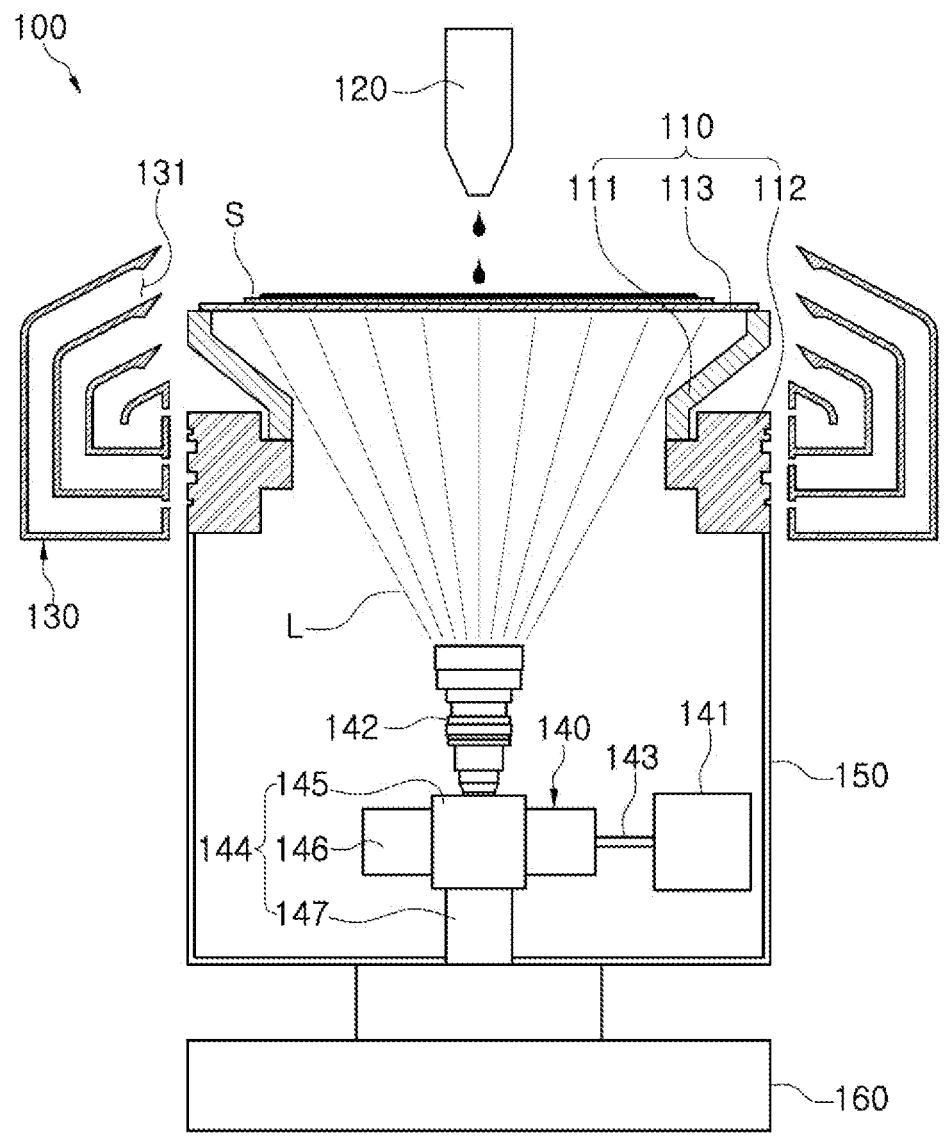
FIG. 5 is a view illustrating an operation state of the substrate treatment apparatus.
Figure 6:
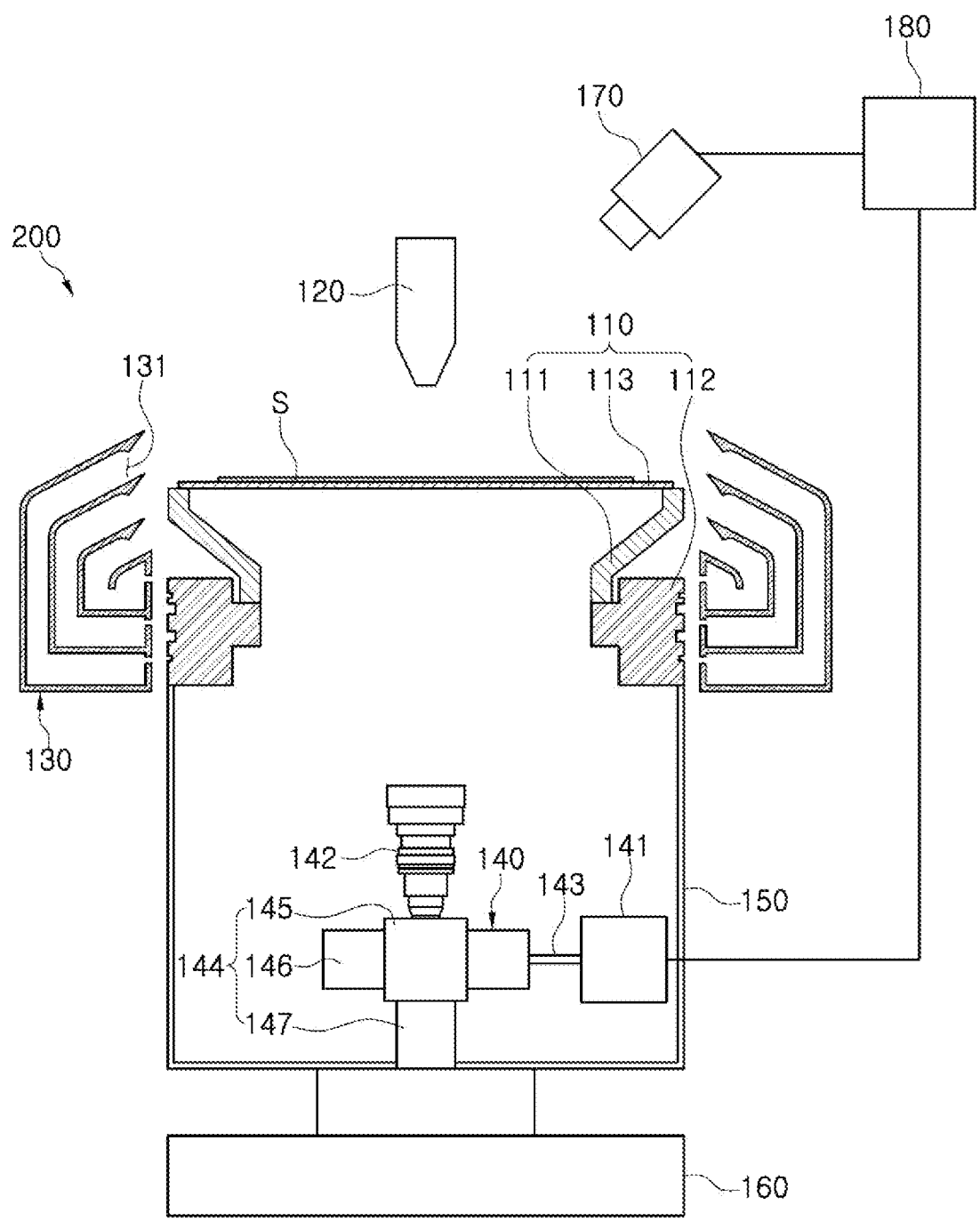
FIG. 6 is a cross-sectional view illustrating a substrate treatment apparatus according to a second embodiment of the present invention.

As illustrated in FIG. 5, according to one embodiment of the present invention, the substrate treatment apparatus 100 includes a laser irradiation unit 140 that irradiates the substrate S with a laser beam L to heat the substrate S. The substrate treatment apparatus according to one embodiment of the present invention applies a laser beam from a long distance, thereby dramatically increasing the etching rate of phosphoric acid serving as a chemical solution.

The substrate treatment apparatus may rapidly raise and lower the temperature of the substrate while treating the surface of the substrate S, thereby precisely controlling the temperature of the substrate S. The substrate treatment apparatus according to one embodiment of the present invention may apply a laser beam having a wavelength that may be easily absorbed by the substrate S, thereby improving the light efficiency.

The substrate treatment apparatus 100 according to one embodiment of the present invention may heat the phosphoric acid discharged to the substrate S as well as the substrate S during a substrate treatment process. Therefore, the substrate treatment apparatus 100 according to one embodiment of the present invention may significantly increase the etching rate (ER) compared to conventional counterparts that have only a function of discharging phosphoric acid to a substrate. Therefore, the substrate treatment apparatus according to the invention enables an etching process that may cope with high density, high integration, and high performance of semiconductor devices.

A substrate treatment apparatus 200 according to a second embodiment of the present invention additionally includes a temperature measuring member 170 (i.e., a thermometer)

and a controller 180 compared to the substrate treatment apparatus 100. In an example embodiment, the temperature measuring member 170 may include a touchless thermometer such as an infrared thermometer.

The temperature measuring member 170 measures the temperature of the substrate S. The temperature measuring member 170 measures the temperature of the substrate S heated by the laser in real time. Temperature data acquired by the temperature measuring member 170 is transmitted to the controller 180.

The controller 180 controls the output (i.e., intensity) of the laser beam generated by the laser irradiation unit 140 on the basis of the temperature of the substrate S measured by the temperature measuring member 170. When the temperature of the substrate S is lower than a reference temperature, the output of the laser is increased. Conversely, when the temperature of the substrate S is higher than the reference temperature, the laser output is reduced.

That is, according to one embodiment of the present invention, the substrate treatment apparatus 200 according to the second embodiment of the present invention is capable of rapidly achieving a target temperature compared to the substrate treatment apparatus 100 according to the first embodiment described above. In addition, the substrate treatment apparatus 200 according to the second embodiment of the present invention prevents the substrate S from being overheated by a laser beam.

With the use of the substrate treatment apparatus 200 according to the second embodiment of the present invention, the temperature of the substrate S may be maintained to be close to the reference temperature due to the presence of the temperature measuring member 170.

Although various embodiments of the present invention have been described above, the drawings and detailed description of the present invention are intended to illustrate the present invention and are not intended to limit the scope of the present invention. Therefore, those skilled in the art will appreciate that various modifications and equivalents thereto are possible. Accordingly, the true technical protection scope of the present invention should be determined by the technical idea defined in the appended claims.

What is claimed is:

1. A substrate treatment apparatus comprising:
   a rotation unit configured to rotate a substrate;
   a chemical discharge unit configured to discharge a chemical solution to a front surface of the substrate on the rotation unit;
   a chemical recovery unit disposed close to the rotation unit and configured to collect a portion of the chemical solution scattered by the rotation unit; and
   a laser irradiation unit disposed under the rotation unit and configured to emit a laser beam to a rear surface of the substrate and heat the substrate,
   wherein the rotation unit includes:
      a supporting member made of a transparent material so that the laser beam emitted by the laser irradiation unit is transmitted through the supporting member to the rear surface of the substrate, the rear surface directly contacting the supporting member; and
      a rotation member engaged with the supporting member and configured to support an edge of the supporting member.

2. The substrate treatment apparatus according to claim 1, wherein the rotation member has a vertical through hole extending from a top of the rotation member to a bottom thereof.

3. The substrate treatment apparatus according to claim 2, wherein the rotation member includes a first portion near the laser irradiation unit and a second portion near the supporting member, and
wherein the rotation member has an inner diameter that gradually increases from the first portion to the second portion.

4. The substrate treatment apparatus according to claim 2, further comprising:
   a drive member engaged with the rotation member and configured to rotate the rotation member.

5. The substrate treatment apparatus according to claim 2, further comprising:
   a housing member engaged with the rotation unit and configured to accommodate the laser irradiation unit; and
   a lifter engaged with the housing member and configured to lift the housing member so that the rotation unit is moved upward and downward relative to the chemical recovery unit.

6. The substrate treatment apparatus according to claim 5, wherein the housing member is configured to maintain, when the housing member is moved up and down by the lifter, a constant relative position between the laser irradiation unit and the rotation unit.

7. The substrate treatment apparatus according to claim 5, wherein the chemical recovery unit is configured to surround a perimeter of the rotation unit.

8. The substrate treatment apparatus according to claim 7, wherein the chemical recovery unit includes a plurality of inlets separated from each other and arranged in a vertical direction.

9. The substrate treatment apparatus according to claim 8, wherein the lifter is configured to move the chemical recovery unit upward and downward so that a selected one of the plurality of inlets is positioned close to the supporting member.

10. The substrate treatment apparatus according to claim 5, wherein the housing member includes an upper portion which is coupled to a lower portion of the rotation unit, and
wherein the laser irradiation unit is disposed on a bottom surface in the housing member.

11. The substrate treatment apparatus according to claim 1, wherein the laser irradiation unit is positioned below the rotation unit and is configured to emit the laser beam toward the substrate positioned on the rotation unit.

12. The substrate treatment apparatus according to claim 1, wherein the laser irradiation unit comprises:
   a laser configured to generate the laser beam;
   a laser transfer member connected to the laser and configured to receive the laser beam generated by the laser;
   a laser inspection member connected to the laser transfer member and configured to inspect a state of the laser beam transferred through the laser transfer member; and
   a lens member connected to the laser inspection member and configured to refract the laser beam transferred by the laser transfer member and to irradiate the substrate with the laser beam refracted by the lens member.

13. The substrate treatment apparatus according to claim 12, wherein the laser beam has a wavelength which is absorbed by the substrate.

14. The substrate treatment apparatus according to claim 12, wherein the laser inspection member comprises:
a reflection unit configured to reflect a first portion of the laser beam transferred by the laser transfer member toward the lens member and to pass a second portion of the laser beam;
an image pickup unit engaged with the reflection unit and configured to capture an image of the second portion of the laser beam passing through the reflection unit; and
a sensing unit engaged with the reflection unit and configured to sense an intensity of the laser beam which is incident on the reflection unit.

15. The substrate treatment apparatus according to claim 14, wherein the lens member comprises:
a plurality of lenses configured to refract the second portion of the laser beam; and
a lens barrel configured to accommodate the plurality of lenses and to allow a distance between at least two lenses of the plurality of lenses to be varied.

16. The substrate treatment apparatus according to claim 14, wherein the image pickup unit is configured to:
receive the second portion of the laser beam via the reflection unit from the laser irradiation unit;
convert the second portion of the laser beam to image data; and
analyze the image data.

17. The substrate treatment apparatus according to claim 1, further comprising:
a thermometer configured to measure a temperature of the substrate; and
a controller configured to control, in response to the temperature of the substrate measured by the temperature measuring member, a power of the laser beam generated by the laser irradiation unit.

18. The substrate treatment apparatus according to claim 1, wherein the chemical recovery unit includes a chemical solution regeneration unit configured to recycle the portion of the chemical solution collected by the chemical recovery unit.

19. The substrate treatment apparatus according to claim 1, wherein the chemical solution ejected from the chemical discharge unit is an aqueous phosphoric acid solution.

20. A substrate treatment apparatus comprising:
a rotation unit including a rotation member configured to rotate a substrate and a supporting member made of a transparent material to transmit a laser beam therethrough and configured to support the substrate;
a chemical discharge unit configured to discharge a chemical solution to the rotation unit;
a chemical recovery unit disposed to surround a perimeter of the rotation unit and configured to collect a chemical solution scattered from the rotation unit and to recycle the recovered chemical solution; and
a laser irradiation unit positioned below the rotation unit and configured to emit a laser beam to a rear surface of the substrate and to heat the substrate,
wherein the laser irradiation unit comprises:
a laser configured to generate the laser beam having a wavelength that is absorbed by the substrate and to emit the laser beam to the substrate;
a laser transfer member connected to the laser and configured to receive the laser beam generated by the laser;
a laser inspection member connected to the laser transfer member and configured to inspect a state of the laser beam transferred through the laser transfer member; and
a lens member connected to the laser inspection member and configured to refract the laser beam transferred by the laser transfer member and to irradiate the substrate with the laser beam refracted by the lens member.

* * * * *